United States Patent [19]
Sung et al.

[11] Patent Number: 6,024,802
[45] Date of Patent: Feb. 15, 2000

[54] VAPOR TREATMENT PROCESS FOR REDUCING OXIDE DEPLETION

[75] Inventors: Mei-Hui Sung, Taichung Hsien; Shih-Kuan Tai, Pu-Tzu, both of Taiwan

[73] Assignee: Winbond Electronics Corp., Hsin-Chu, Taiwan

[21] Appl. No.: 09/124,879

[22] Filed: Jul. 30, 1998

[30] Foreign Application Priority Data

May 29, 1998 [TW] Taiwan ................................. 87108389

[51] Int. Cl.[7] .............................. B08B 6/00; B08B 7/04; B08B 3/00; B08B 1/02
[52] U.S. Cl. ................................. 134/3; 134/1.3; 134/18; 134/29; 134/32; 134/34; 134/902; 134/1.2
[58] Field of Search .................. 134/3, 1.2, 1.3, 134/18, 29, 32, 34, 902

[56] References Cited

U.S. PATENT DOCUMENTS 5,693,148 12/1997 Simmons et al. ...................... 134/18

*Primary Examiner*—Randy Gulakowski
*Assistant Examiner*—Yolanda E. Wilkins
*Attorney, Agent, or Firm*—Thomas, Kayden, Horstemeyer & Risley

[57] ABSTRACT

A vapor processing method for reducing oxide material depletion includes an early step of placing a polymer-coated substrate inside a vapor process chamber (VPC), a pre-processing step of passing an inert gas into the VPC for a definite period followed by an idling period, a clearing step of passing a reactive gas carried by an inert carrier into the VPC for clearing away previously deposited polymer on the substrate, and a post-processing step of passing an inert gas into the VPC to purge any unreacted reactive gases. Thereafter, the substrate is transferred to a dry task chamber (DTC) for cleaning, wherein the cleaning includes removing any residual gases on the wafer surface. Time required for cleaning the wafer in the DTC is smaller than the total time required for pre-processing, polymer clearing and post-processing.

20 Claims, 4 Drawing Sheets

VAPOR TREATMENT PROCESS FOR REDUCING OXIDE DEPLETION

CROSS-REFERENCE TO RELATED APPLICATION

This application claims the priority benefit of Taiwan application Ser. No. 87108389, filed May 29, 1998, the full disclosure of which is incorporated herein by reference.

BACKGROUND OF THE INVENTION

1. Field of Invention

The present invention relates to a hydrofluoric acid (HF) vapor treatment process. More particularly, the present invention relates to a vapor treatment process that is capable of reducing oxide depletion.

2. Description of Related Art

Metal-oxide-semiconductor (MOS) transistors are one of the basic electronic devices in very large scale integration (VLSI) circuits. In general, a MOS transistor is made by forming an isolating region above a substrate, and then forming a stack of layers composed of various materials above the substrate. The most commonly used materials for forming the stack include silicon nitride/tungsten silicide/polysilicon/silicon dioxide ($SiN/WSi/Polysilicon/SiO_2$). Next, using a patterned photoresist layer as a mask, the stack is etched to form a gate structure of a MOS transistor in the device area.

When the stack is etched to form the gate structure, a layer of polymer will also be formed around the gate terminal as a side reaction. In general, the polymer layer has to be removed using a hydrogen fluoride vapor etching method. However, the same hydrogen fluoride vapor for etching away the deposited polymer will also act on the protective oxide layer formed over the substrate for preventing damages by subsequent ion implantation. Consequently, using the conventional method to remove polymer deposit in a production line will lead to oxide depletion, and will result in low wafer yield.

FIG. 1A is a diagram showing the flow of wafers through a conventional vapor processing station for removing residual polymeric material around gate terminal structures.

First, as shown in FIG. 1A, a wafer 100 having residual polymeric material surrounding its gate structures is placed on the loader 102 of a processing station. Next, the wafer 100 is moved to the vapor process chamber 104 (VPC). Inside the vapor process chamber 104, hydrogen fluoride vapor reacts with the residual polymer. When the residual polymer is removed, the wafer 100 is transferred to the dry task chamber 106 (DTC) where the wafer 100 is cleaned with de-ionized water (DIW) to remove any residual gases on the wafer surface.

Finally, the wafer 100 is transferred from the DTC 106 to the unloader 108, and then the processed wafer 100 is transferred back to the production line from the unloader 108 for subsequent operations. Meanwhile, wafers 111, 122 and 133 are also fed to the processing station one by one and pass through various stages inside the processing station as indicated in FIG. 1A.

FIG. 1B is a diagram showing timing relation of various stages inside the vapor process chamber of a conventional processing station for clearing residual polymer around the gate structure of a wafer. In FIG. 1B, the vertical axis indicates the rotating speed (in rpm) of the wafer stand and the horizontal axis indicates the time (in seconds) inside the vapor process chamber. Furthermore, stages for carrying out each processing operation and the treatment within each time slot are also indicated.

The wafer 122 within the vapor process chamber 104 actually passes through three stages. In stage 1, gaseous nitrogen having a flow rate of about 20 liters per second (l/s) is passed into the vapor process chamber, and the operation is maintained for about 20 seconds. Next, in stage 2, gaseous hydrogen fluoride carried by gaseous nitrogen with a flow rate also of about 20 (l/s) is passed continuously for about 15 second. Finally, in stage 3, gaseous nitrogen having a flow rate of about 20 (l/s) is again passed into the vapor process chamber continuously for about 30 seconds so that residual gaseous hydrogen fluoride within the chamber is purged. Therefore, the total time spent in processing within the vapor process chamber 104 is about 67 seconds.

After the processing treatment within the vapor process chamber 104, the wafer is transferred to the dry task chamber 106, where the wafer is cleaned and dried.

FIG. 1C is a diagram showing the timing relation of various stages inside the dry task chamber of a conventional processing station for clearing residual polymer around the gate structure of a wafer. In FIG. 1C, the vertical axis indicates the rotating speed (in rpm) of the wafer stand and the horizontal axis indicates the time (in seconds) inside the dry task chamber. Furthermore, stages for carrying out each processing operation and the treatment within each time slot are also labeled.

Inside the dry task chamber 106, the wafer stand at first spins at about 500 rpm while de-ionized water (DIW) is sprayed on the top and backs surfaces of the wafer for about 25 seconds to remove any residual gases. Next, the wafer stand slows down to about 50 rpm, and then de-ionized water is again sprayed for another 5 seconds.

Thereafter, the wafer stand speeds up to around 2000 rpm and maintains that speed for about 60 seconds to carry out a spin/dry (S/D) operation. Due to high centrifugal force created by rapid spinning, the surfaces of wafer 111 are dried. Finally, the spinning wafer stand is allowed to stop within about 3 seconds. Hence, the total time spent within the dry task chamber 106 is about 101 seconds.

In a conventional processing station for removing residual polymer around a gate structure of a wafer, the wafer remains in the vapor process chamber (VPC) for a period of about 67 seconds, while the wafer has to remain in the dry task chamber (DTC) for a period of about 101 seconds.

Therefore, for a continuous flow system as shown in FIG. 1A, when the wafer 111 in the DTC 106 finishes processing, the wafer 122 in the VPC 104 has already finished all its required operations and has been left waiting for about 34 seconds. Since the following wafer 122 has to sit idle in the VPC 104 for about 34 seconds, any residual hydrogen fluoride in the chamber will continue its etch on oxide material and result in oxide depletion.

FIG. 1D is a diagram showing gate oxide material depletion versus slots on a piece of wafer after hydrogen fluoride vapor etching operation in a processing station.

In FIG. 1D, the vertical axis indicates thickness of the gate oxide material wasted in the vapor etching process and the horizontal axis indicates various slots on the wafer. For the aforementioned conventional method, a gate oxide thickness of between 6.02–12.17 Å is lost. With a thick layer of gate oxide material removed, subsequent ion implantation operations can result in considerable damages to the substrate surface.

In light of the foregoing, there is a need to provide a method of reducing gate oxide depletion.

SUMMARY OF THE INVENTION

Accordingly, the present invention provides a processing method for reducing oxide material depletion. By introducing an additional idling period during which no hydrogen fluoride vapor are present while a wafer is in the vapor process chamber (VPC), the wafer can remain in the VPC longer than in the dry task chamber (DTC) without any oxide depletion. Hence, the problem of oxide depletion by residual hydrogen fluoride while the wafer is waiting inside a VPC is prevented.

To achieve these and other advantages and in accordance with the purpose of the invention, as embodied and broadly described herein, the invention provides a processing method for reducing oxide depletion on a substrate. The processing method includes an early step of placing a polymer-coated substrate inside a vapor process chamber (VPC).

Next, a pre-processing operation is carried out by passing an inert gas into the VPC for a definite period followed by an idling period. Thereafter, a clearing step is carried out passing a reactive gas carried by an inert carrier into the VPC for removing previously deposited polymer on the substrate. After the polymer on the wafer is removed, a post-processing operation is carried out.

In the post-processing operation, inert gas is again passed into the vapor process chamber to purge any unreacted reactive gases. Thereafter, the wafer is transferred to a dry task chamber (DTC) for cleaning, wherein the cleaning operation includes removing any residual gases on the wafer. Time required for cleaning the wafer in the DTC is smaller than the total time required for pre-processing, polymer clearing and post-processing. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
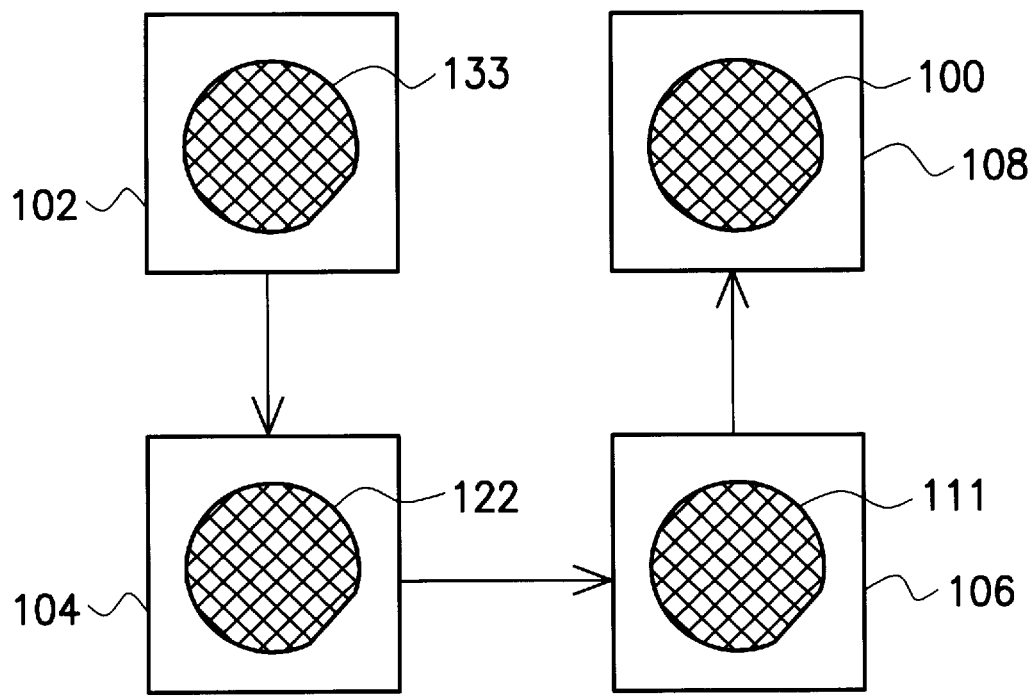
FIG. 1A is a diagram showing the flow of wafers through a conventional vapor processing station for removing residual polymeric material around gate terminal structures.
Figure 1B:
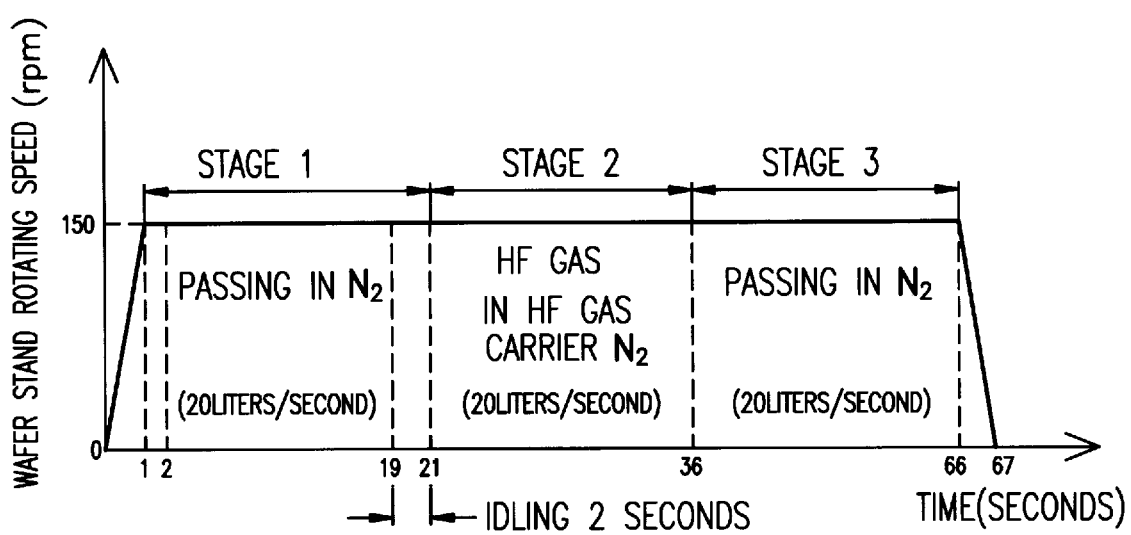
FIG. 1B is a diagram showing timing relations of various stages inside the vapor process chamber of a conventional processing station for clearing residual polymer around the gate structure of a wafer.
Figure 1C:
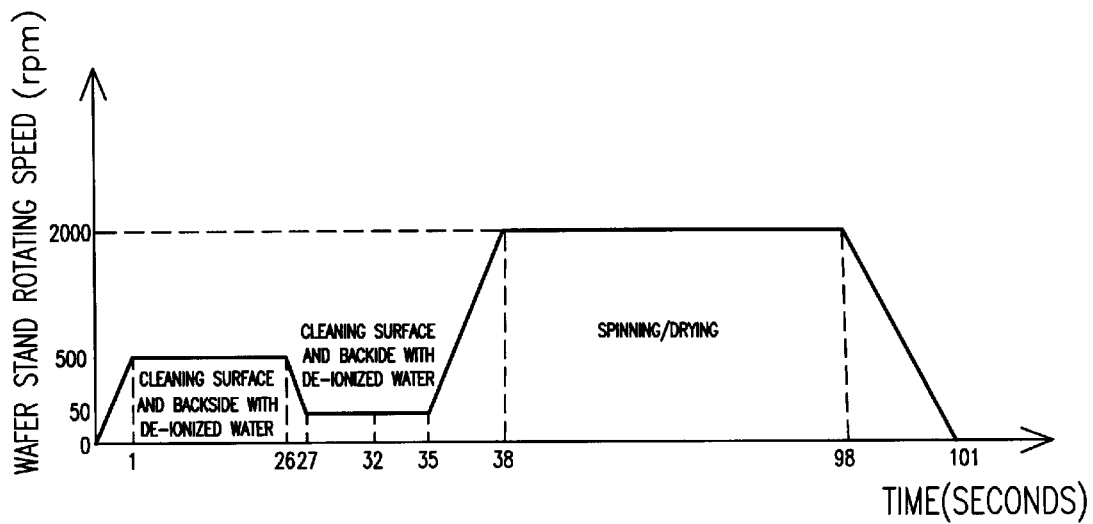
FIG. 1C is a diagram showing timing relation of various stages inside the dry task chamber of a conventional processing station for clearing residual polymer around the gate structure of a wafer.
Figure 1D:
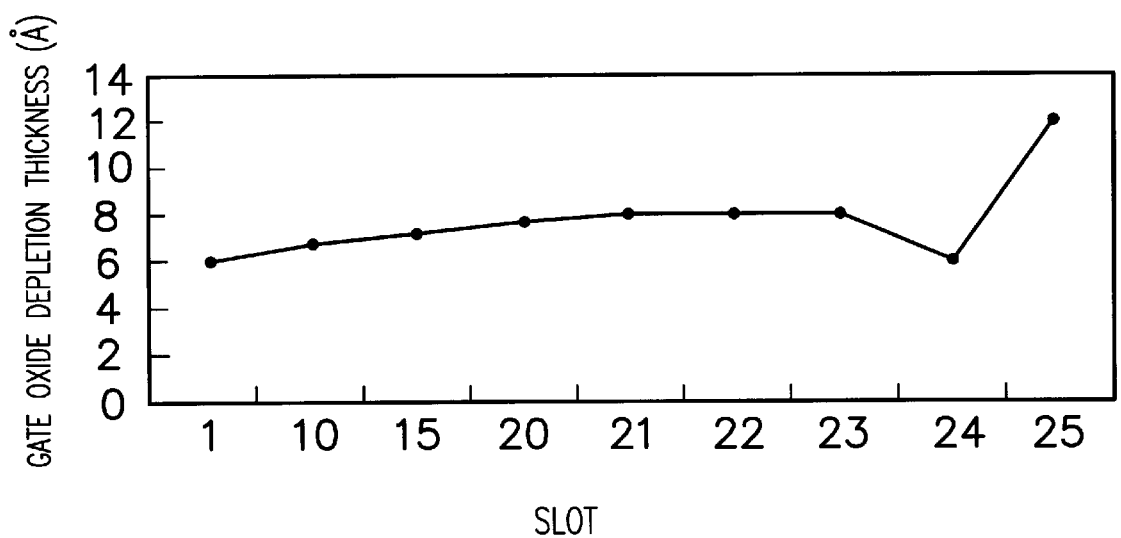
FIG. 1D is a diagram showing gate oxide material depletion versus slots on a wafer after hydrogen fluoride vapor etching operation in a processing station.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
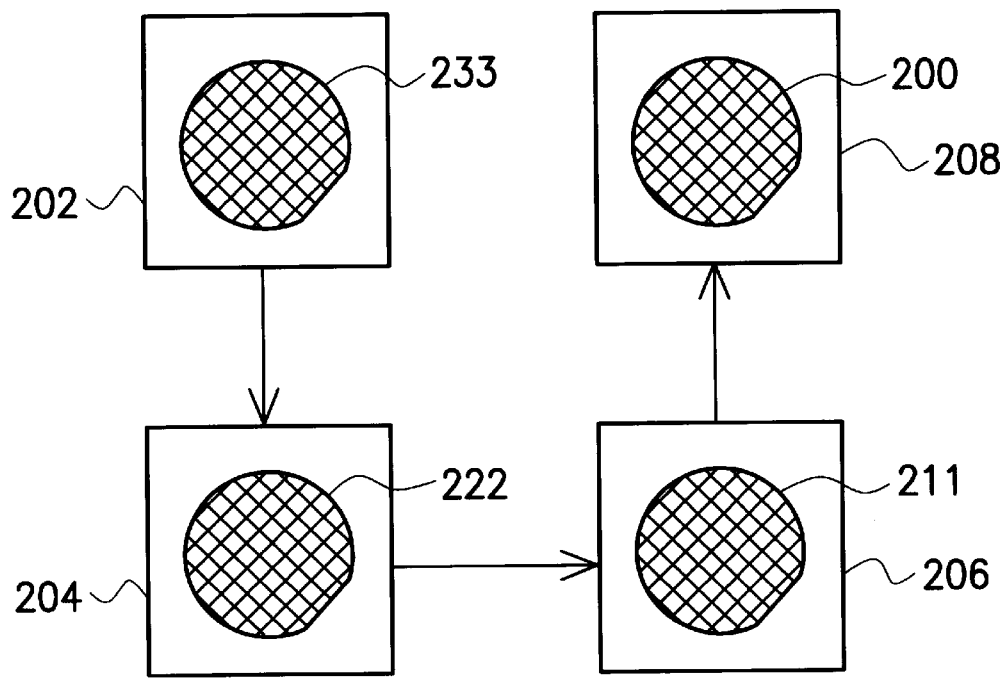
FIG. 2A is a diagram showing the flow of wafers through a processing station for removing residual polymeric material around gate terminal structures with minimum oxide depletion according to one preferred embodiment of this invention.

FIG. 2A is a diagram showing the flow of wafers through a processing station for removing residual polymeric material around gate terminal structures with minimum oxide depletion according to one preferred embodiment of this invention.

First, as shown in FIG. 2A, a wafer 200 having residual polymeric material surrounding its gate structures is placed on the loader 202 of a processing station. Next, the wafer 200 is moved to a vapor process chamber 204 (VPC). Inside the vapor process chamber 204, hydrogen fluoride vapor reacts with the residual polymer. Thereafter, the wafer 200 is transferred to the dry task chamber 206 (DTC) where the wafer 200 is cleaned with de-ionized water (DIW) to purge away any residual gases on the wafer surface.

Finally, the wafer 200 is transferred from the DTC 206 to the unloader 208, and then the processed wafer 200 is transferred back to the production line from the unloader 208. Subsequently, wafers 211, 222 and 233 are also fed to the processing station, one by one, and passed through the various stages inside the processing station as indicated in FIG. 2A.

Figure 2B:
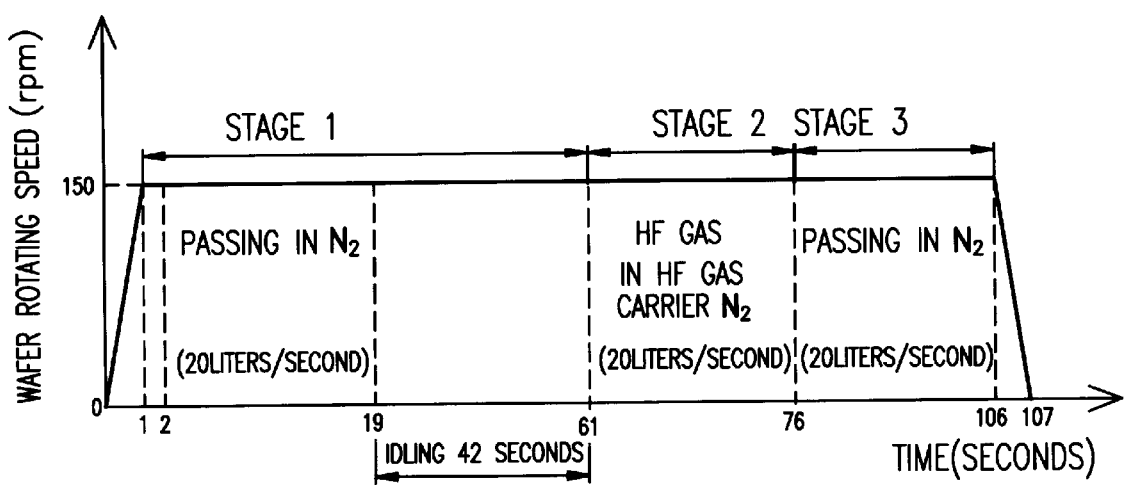
FIG. 2B is a diagram showing timing relations of various stages inside the vapor process chamber of a processing station for clearing residual polymer around the gate structure of a wafer with minimum oxide depletion according to one preferred embodiment of this invention.

FIG. 2B is a diagram showing timing relations of various stages inside the vapor process chamber of a processing station for clearing residual polymer around the gate structure of a wafer with minimum oxide depletion according to one preferred embodiment of this invention. In FIG. 2B, the vertical axis indicates the rotating speed (in rpm) of the wafer stand and the horizontal axis indicates the time (in seconds) inside the vapor process chamber. Furthermore, a time slot for each processing operation and the treatment within each time slot are also labeled clearly.

First, a substrate requiring processing treatment, for example, a wafer 222 having residual polymeric material is placed inside a vapor process chamber 204, then the wafer is subjected to several processing stages in sequence. In stage 1, known as a pre-processing stage, an inert gas, for example, gaseous nitrogen having a flow rate of about 20 l/s is passed into the vapor process chamber for about 18 seconds so that any residual gases are purged.

Next, the vapor process chamber remains idle in this state for another period, preferably about 42 seconds. In other words, idling time of the wafer 222 in the vapor process chamber 204 is about 40 seconds longer than in the conventional process. Consequently, the overall processing time within the vapor process chamber 204 is slightly longer than the processing time in subsequent dry task chamber 206, which requires a total period of 60 seconds.

Next, a stage 2 operation, known as a clearing operation, is carried out. In this stage, a reactive gas, for example, gaseous hydrogen fluoride riding on an inert gaseous carrier such as gaseous nitrogen, is continuously passed into the vapor process chamber 204 for about 15 seconds. Flow rate of the gaseous carrier is about 20 l/s, and the reactive gas serves to clear away any polymeric material on the wafer surface.

Finally, a stage 3 operation or a post-processing operation is carried out. In the post-processing stage, an inert gas, for example, gaseous nitrogen, is again passed into the vapor process chamber 204 for about 30 seconds. The inert gas has a gas flow rate of about 20 l/s and the purpose of the operation is to purge any residual reactive gases remaining in the chamber 204.

In summary, when the wafer 222 is placed inside the vapor process chamber 204 in order to remove polymeric material, the total processing time is the sum of the pre-processing time, the vapor processing time and the post processing time. Moreover, the pre-processing period further includes an idling period.

Of course, the aforementioned processing times in the vapor process chamber 204 are also dependent upon size of the vapor process chamber, amount of polymeric material on a wafer, gaseous flow rates, reacting speed and subsequent total processing time spent inside the dry task chamber 206.

In the example set for illustrating the method of this invention, a total of about 107 seconds are used in the processing operations inside the vapor process chamber 204. This represents 40 seconds more than a conventional method due to the extra idling time in an inert atmosphere. However, this extra idling time in an inert atmosphere is necessary because residual reactive gas (for example, hydrogen fluoride) in the vapor process chamber 204 can continue to erode a portion of the gate oxide material. Hence, excessive oxide depletion of the wafer may result.

After the processing treatment in the vapor process chamber 204, the wafer is transferred into the dry task chamber 206, where the wafer is cleaned and dried.

Figure 2C:
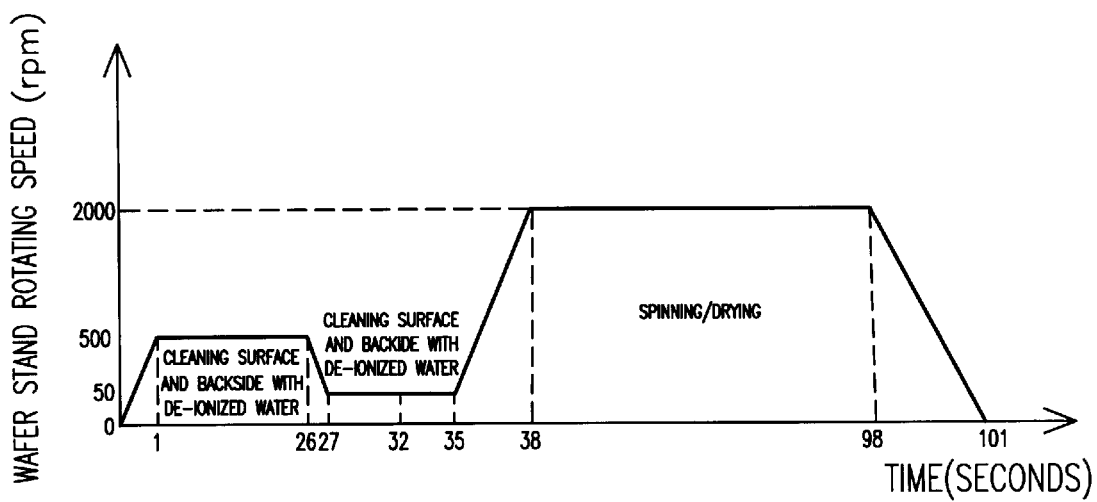
FIG. 2C is a diagram showing timing relations of various stages inside the dry task chamber of a processing station for clearing residual polymer around the gate structure of a wafer with minimum oxide depletion according to one preferred embodiment of this invention.

FIG. 2C is a diagram showing timing relations of various stages inside the dry task chamber of a processing station for clearing residual polymer around the gate structure of a wafer with minimum oxide depletion according to one preferred embodiment of this invention.

In FIG. 2C, the vertical axis indicates the rotating speed (in rpm) of the wafer stand and the horizontal axis indicates the time (in seconds) inside the dry task chamber. The step of clearing away residual gas on a wafer within the dry task chamber 206 can be subdivided into several treatments. Time for carrying out each treatment is labeled clearly in FIG. 2C.

First, the wafer stand within the dry task chamber 206 is made to spin at about 500 rpm while cleaning liquid, preferably de-ionized water (DIW), is sprayed on the top and back surfaces of the wafer 211 for about 25 seconds to remove any residual gases. Next, the wafer stand slows down to about 50 rpm, and then de-ionized water is again sprayed for another 5 seconds.

Subsequently, the wafer stand speeds up to about 2000 rpm and maintains that speed for about 60 seconds to carry out a spin/dry (S/D) operation. Due to high centrifugal force created by rapid spinning, the surfaces of wafer 211 are dried. Finally, the spinning wafer stand is allowed to stop within about 3 seconds. Hence, the total time spent in processing within the dry task chamber 206 is about 101 seconds.

Of course, the aforementioned processing times in the dry task chamber 206 is also dependent upon size of the wafer, amount of residual reactive gas (hydrogen fluoride), rotating speed of the wafer stand and spinning/drying time.

In the embodiment of this invention, the wafer has to spent a total of about 107seconds in the vapor process chamber 204 due to the extra idling period in an inert atmosphere, whereas the same wafer spent a total of just 101 seconds in the dry task chamber 206. Since the time spent in the vapor process chamber 204 is now 6 seconds longer than the time spent in the dry task chamber 206, the wafer 222 in the vapor process chamber 204 no longer has to wait for the end of processing of the wafer 211 in the dry task chamber 206. Therefore, continuous etching by residual hydrogen fluoride in the vapor process chamber 204 due to a waiting period in a reactive atmosphere can be avoided, which prevents oxide depletion.

Figure 2D:
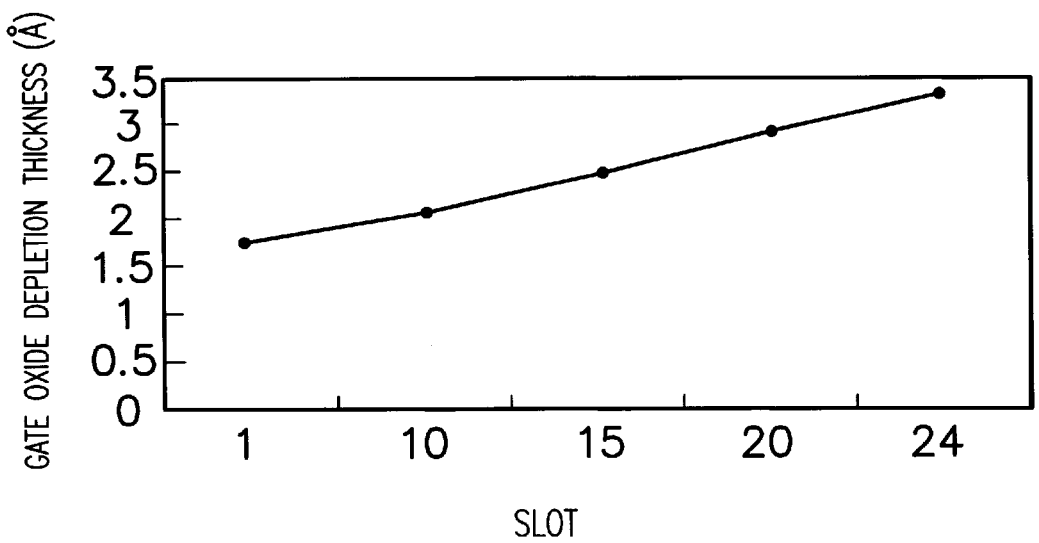
FIG. 2D is a diagram showing gate oxide material depletion versus slots on a wafer after hydrogen fluoride vapor etching in a processing station according to one preferred embodiment of this invention.

FIG. 2D is a diagram showing gate oxide material depletion versus slots on a wafer after hydrogen fluoride vapor etching in a processing station according to one referred embodiment of this invention.

In FIG. 2D, the vertical axis indicates thickness of the gate oxide material wasted in the vapor etching process and the horizontal axis indicates various slots on the wafer 200. For the aforementioned invention, a total thickness of gate oxide material of between 1.8–3.25 Å is lost. Compared with a conventional method, the present invention depletes the thickness of oxide material only a quarter as much. Hence, without the greater depletion of the protective gate oxide, substrate damages resulting from subsequent ion implant is reduced to a minimum.

In addition, some of the processing treatments carried out inside the respective vapor process chamber and the dry task chamber of the processing station of this invention can also be executed within the same chamber when required.

In summary, by introducing an idling period (about 40 seconds) in the vapor process chamber (VPC) and freeing the VPC from reactive gas (for example hydrogen fluoride) during this period, the total length of time the wafer remains in the vapor process chamber is longer than the length of time in the dry task chamber (DTC). Hence, wafer stationed in the VPC does not have to wait for its turn in the DTC in an atmosphere of residual hydrogen fluoride, which would continue its erosion of gate oxide material causing oxide depletion.

In addition, the processing procedure laid out in this invention is very similar to the conventional one, and thus can be duplicated in a standard production line with ease.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A processing method for reducing oxide depletion, comprising the steps of:

placing a polymer-coated wafer into a vapor process chamber;

a pre-processing step of passing an inert gas into the vapor process chamber;

holding the wafer in an idle state for an idling time, the idling time being about 42 seconds;

a clearing step of passing a reactive gas carried by an inert gas carrier into the vapor process chamber so that the reactive gas reacts with material on the wafer and removes the polymeric material;

a post-processing step of passing an inert gas into the vapor process chamber to purge any unreacted reactive gas;

after the post-processing step, immediately transferring the wafer from the vapor process chamber into a dry task chamber, where the wafer is cleaned and dried; and a cleaning step of removing any residual reactive gas remaining on the wafer surface, wherein the time spent in the dry task chamber is slightly shorter than the time spent in the vapor process chamber.

2. The processing method of claim 1, wherein the inert gas used in the pre-processing and post-processing step includes nitrogen.

3. The processing method of claim 1, wherein the reactive gas used in the clearing step includes hydrogen fluoride.

4. The processing method of claim 1, wherein the step of cleaning residual reactive gas includes the substeps of:

treating the top surface and back side of the substrate with a cleaning solution; and carrying out a spinning/drying operation.

5. The processing method of claim 4, wherein the cleaning solution includes de-ionized water.

6. A vapor processing treatment for removing polymeric material on the surface of a wafer, comprising the steps of:

placing the wafer into a first processing chamber for clearing away the polymeric material, wherein the process of removing the polymeric material further includes:

a pre-processing step of passing an inert gas into the first processing chamber;

holding the wafer in an idle state for an idling time;

a clearing step of passing a reactive gas carried by an inert gas carrier into the first processing chamber so that the reactive gas reacts with material on the substrate and removes the polymeric material; and a post-processing step of passing an inert gas into the first processing chamber to purge any unreacted reactive gas; and after the post-processing step, immediately transferring the wafer from the first processing chamber into a second processing chamber, and then carrying out a cleaning operation to remove any residual gas on wafer surface, wherein the cleaning step includes:

cleaning the top and the back side surface of the wafer using a cleaning solution; and performing a spinning/drying operation to spin-dry the wafer, wherein the time spent in the second processing chamber is slightly smaller than the time spent in the first processing chamber.

7. The processing method of claim 6, wherein the polymeric material on the wafer surface is formed when the wafer is patterning to form gate structures.

8. The processing method of claim 6, wherein the inert gas used in the pre-processing and post-processing step includes nitrogen.

9. The processing method of claim 6, wherein the reactive gas used in the clearing step includes hydrogen fluoride.

10. The processing method of claim 6, wherein the cleaning solution includes de-ionized water.

11. A vapor processing method suitable for removing polymeric material on a substrate, the method comprising the steps of:

clearing away the polymeric material on the substrate using a reactive gas within a first operating period; and cleaning to remove any residual reactive gas on the substrate within a second operating period, wherein the first operating period is longer than the second operating period.

12. The processing method of claim 11, wherein the step of clearing away the polymeric material on the substrate further includes the substeps of:

an early step of placing a polymer-coated substrate into a processing chamber;

a pre-processing step of passing an inert gas into the processing chamber and remaining in an idle state for some time;

a clearing step of passing a reactive gas carried by an inert gas carrier into the processing chamber so that the reactive gas reacts with material on the substrate and removes the polymeric material; and a post-processing step of passing an inert gas into the processing chamber to purge any unreacted reactive gas, wherein the first operating period is the total time used in carrying out the pre-processing, the clearing and the post-processing operations.

13. The processing method of claim 12, wherein the inert gas used in the pre-processing and post-processing step includes nitrogen.

14. The processing method of claim 11, wherein the reactive gas used in the clearing step includes hydrogen fluoride.

15. The processing method of claim 11, wherein the step of cleaning to remove any residual gas on substrate surface further includes the substeps of:

cleaning the top and back side surface of the substrate using a cleaning solution; and performing a spinning/drying operation to spin-dry the substrate.

16. The processing method of claim 15, wherein the cleaning solution includes de-ionized water.

17. The processing method of claim 6, wherein the first processing chamber is a vapor process chamber.

18. The processing method of claim 6, wherein the time spent in the first processing chamber includes the time spent in pre-processing step, the idling step, the clearing step and the post-processing step combined together.

19. The processing method of claim 6, wherein the second processing chamber is a dry task chamber.

20. The processing method of claim 6, wherein the time spent in the second processing chamber includes the time spent in the cleaning step and the spinning/drying operation combined together.

* * * * *